United States Patent [19]

Kikuchi

[11] Patent Number: 5,777,396
[45] Date of Patent: Jul. 7, 1998

[54] CIRCUIT CONNECTING DEVICE

[75] Inventor: Shinji Kikuchi, Tokyo, Japan

[73] Assignee: Asahi Kogaku Kogyo Kabushiki Kaisha, Tokyo, Japan

[21] Appl. No.: 401,114

[22] Filed: Mar. 9, 1995

[30] Foreign Application Priority Data

Mar. 11, 1994 [JP] Japan .................... 6-067833

[51] Int. Cl.$^6$ .................... H01H 1/04
[52] U.S. Cl. .................... 307/112; 363/142; 439/638; 307/147
[58] Field of Search .................... 363/142, 143; 307/112, 147, 150, 151, 80, 85; 439/625, 638, 639

[56] References Cited

U.S. PATENT DOCUMENTS

| | | |
|---|---|---|
| 4,131,805 | 12/1978 | Austin et al. .................... 307/147 |
| 4,608,498 | 8/1986 | Falzarano et al. .................... 307/22 |
| 4,890,217 | 12/1989 | Conway .................... 363/143 |
| 5,334,045 | 8/1994 | Cappa et al. .................... 439/506 |

*Primary Examiner*—John W. Cabeca
*Assistant Examiner*—Jonathan Kaplan
*Attorney, Agent, or Firm*—Greenblum & Bernstein P.L.C.

[57] ABSTRACT

A circuit connecting device is used to switch a characteristic of a circuit among a plurality of operating conditions. The circuit connecting device has a set of source terminals, a plurality of sets of receptor terminals and a selector for selectively connecting the set of source terminals to one set of the plurality of sets of receptor terminals. The selector simultaneously connects every terminal of the set of source terminals to a corresponding terminal of the selected set of receptor terminals. This results in the operating condition of the characteristic of the circuit being determined in accordance with the set of receptor terminals which is selected by the selector.

19 Claims, 3 Drawing Sheets

CIRCUIT CONNECTING DEVICE

BACKGROUND OF THE INVENTION

The present invention relates to a circuit connecting device used to determine electrical characteristics of a circuit depending on the way the circuit connecting device is connected in the circuit.

Recently, electrophotographic imaging devices such as laser beam printers and copiers have becoming popular throughout the world. In order to make the manufacturing of these electrophotographic imaging devices more efficient, power supply systems that can utilize 100-120 VAC and 220-240 VAC are incorporated into the electrophotographic imaging devices. Then, depending on the country where the electrophotographic imaging device is to be sold, the appropriate operating voltage characteristics of the power supply are set using internal switches.

In a standard power supply system, many internal switches are required in order to set the appropriate operating voltage characteristics. For instance, a switch is required to select the input terminals that should be connected to the power supply line, and another switch is required to select the proper transformer ratio so that the proper output voltage will be generated. Further, another switch is required to connect a halogen lamp, which is used in the electrophotographic imaging device, to the power supply line.

Therefore, when the electrophotographic imaging device is being manufactured, many internal switches on the power supply unit must be properly set in order to ensure correct operation of the imaging device. Further, depending on the type of internal switch used, one or more of the switches could be accidentally switched during shipping of the imaging device, resulting in a faulty operation when the imaging device is connected to the local power supply of the destination country.

SUMMARY OF THE INVENTION

It is therefore an object of the present invention to provide an improved circuit connecting device used with a power supply unit of, for example, an electrophotographic imaging device, to ensure correct operation of the imaging device at the desired voltage setting.

It is another object of the present invention to provide an improved circuit connecting device, used with a power supply of, for example, an electrophotographic imaging device, having an attached external device. The improved circuit connecting device is constructed such that external device only operates when the desired voltage setting matches the voltage rating of the external device.

According to an aspect of the present invention, there is provided a circuit connecting device used to switch a characteristic of a circuit among a plurality of operating conditions. The circuit connecting device includes a set of source terminals, a plurality of sets of receptor terminals, and a mechanism for selectively connecting the set of source terminals to one set of the plurality of sets of receptor terminals. The connecting mechanism simultaneously connects every terminal of the set of source terminals to a corresponding terminal of the selected set of receptor terminals. Thus, the operating condition of the characteristic of the circuit is determined in accordance with the set of receptor terminals which is selected by the connecting mechanism. Optionally, when the connecting mechanism connects the set of source terminals to one set of receptor terminals, the characteristic has a first operating condition, and when the connecting mechanism connects the set of source terminals to another set of receptor terminals, the characteristic has a second operating condition.

Further optionally, the connecting mechanism includes a plurality of receptor connectors, such that each of the receptor connectors is connected to one of the sets of the receptor terminals, and a source connector is connected to the set of source terminals. When the source connector is mated with one of the receptor connectors, the characteristic has one of the plurality of operating conditions.

Still optionally, each of the receptor connectors has a plurality of conductors, and each of the conductors is electrically connected to a corresponding one of the receptor terminals. The source connector has a plurality of conductors, and each of the conductors is electrically connected to a corresponding one of the source terminals.

Still further optionally, the circuit connecting device has each set of receptor terminals and the set of source terminals formed on a circuit board.

Alternatively, the circuit connecting device further includes at least one cover member. When the characteristic has one of the plurality of operating conditions, the cover member is positioned to cover the receptor connectors that are not to be connected to the source terminals.

Optionally, the circuit connecting device further includes a casing which has a plurality of information plates, each of which has information related to a corresponding one of the plurality of operating conditions of the characteristic. When the cover member covers the receptor connectors that are not to be connected to the source terminals, the cover member covers the information plates that are not related to a current operating condition of the characteristic.

Alternatively, the connecting mechanism includes a plurality of terminal connectors, each of which is connected to the source terminals, and one set of the plurality of receptor terminals, and a bridging connector which mates with one of the plurality of terminal connectors.

According to another aspect of the present invention, there is provided a combination of a circuit connecting device used to switch a characteristic of a circuit among a plurality of operating conditions, and an external device attached to the circuit. The external device is operable when the characteristic has a predetermined one of the operating conditions. The circuit connecting device includes a set of source terminals, a plurality of sets of receptor terminals, and a mechanism for selectively connecting the set of source terminals to one set of the plurality of sets of receptor terminals. The connecting mechanism simultaneously connects every terminal of the set of source terminals to a corresponding terminal of the selected set of receptor terminals. Thus, the characteristic of the circuit is determined in accordance with the set of receptor terminals which is selected by the connecting mechanism.

The external device includes an external device connector having at least one operating conductor and at least one non-operating conductor. The operating conductor is connected to a terminal of one of the set of receptor terminals, and the non-operating terminal is connected to a terminal of another set of the receptor terminals. The external device is operable only when the set of receptor terminals which are connected to the operating conductor are connected to the set of source terminals.

According to another aspect of the present invention, there is provided a combination of a circuit which has at least two operating conditions, the circuit having an output connector connected thereto, and an external device having an input connector which is connected to the output connector in order to operate the external device. The output connector has a plurality of output conductors, some of which are selectively connectable to the circuit in accordance with the operating condition of the circuit. The input connector has a plurality of input conductors to be connected to the output conductors. The external device is electrically connected to the input conductors which correspond to the selectively connected output conductors, and; the external device is operable when the circuit has a predetermined one of the at least two different operating conditions.

According to another aspect of the present invention, there is provided a circuit including a source connector provided with a set of source terminals, and a plurality of receptor connectors, each of which is provided with a set of receptor terminals. The source connector simultaneously connects each of the source terminals to a corresponding one of the receptor terminals when the source connector is connected to one of the plurality of receptor connectors. Thus, a characteristic of the circuit is determined in accordance with which of the plurality of receptor connectors is connected to the source connector.

DESCRIPTION OF THE EMBODIMENTS

Figure 1:
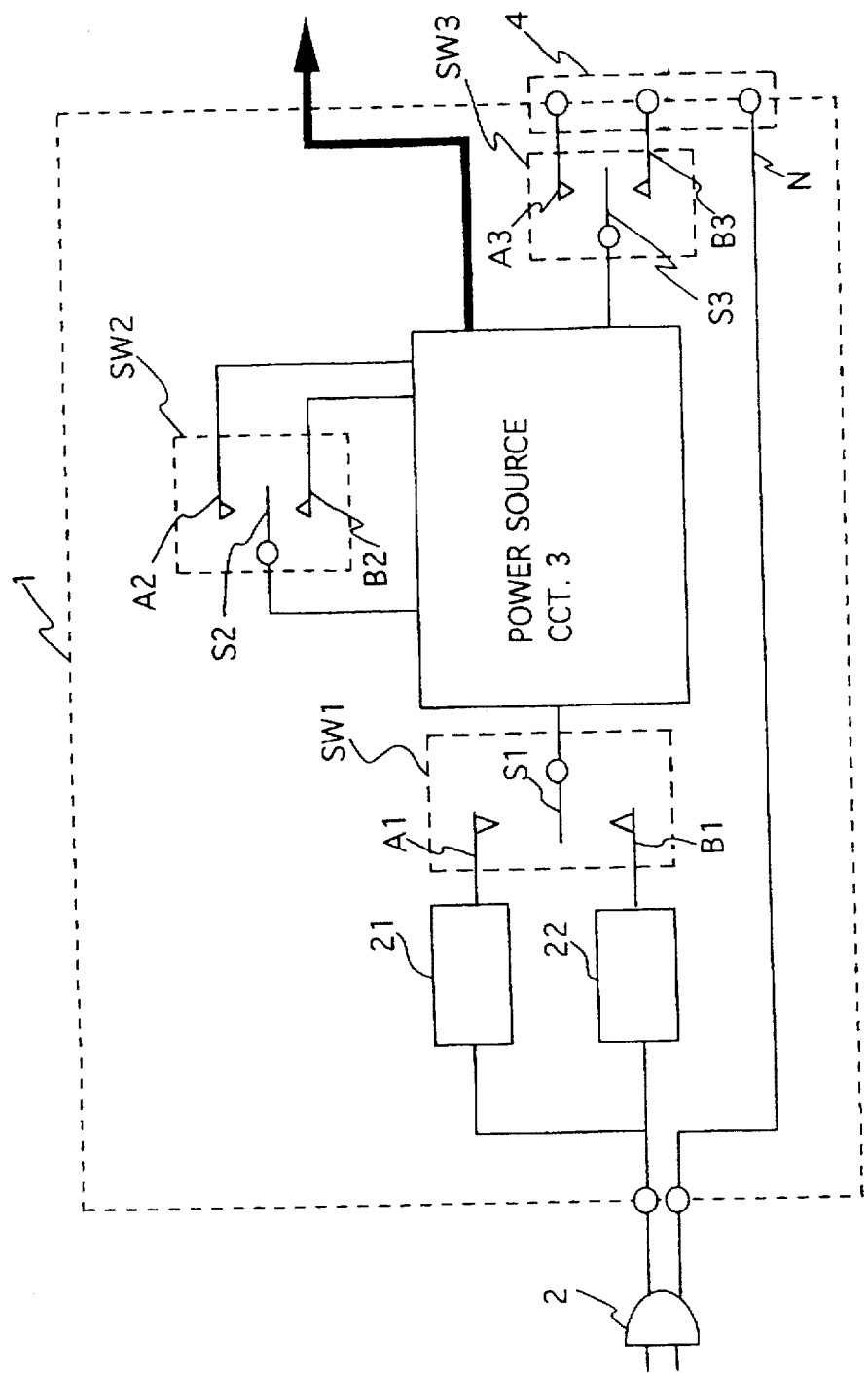
FIG. 1 is a block diagram illustrating a power supply unit of a laser beam printer embodying the present invention.

FIG. 1 shows a power supply unit 1 which embodies the present invention. In the power supply unit 1, power is supplied from a power grid via a plug 2. The supplied AC voltage is transformed and rectified by a power source circuit 3 and output to various circuits used in an electrophotographic imaging device.

As mentioned above, there are two common grid voltages used worldwide (i.e., 100–120 VAC, hereinafter referred to as 110 VAC, and 220–240 VAC, hereinafter referred to as 220 VAC). The power supply unit 1 according to the first embodiment of the present invention, may be connected to an electrical grid operating at either 110 VAC or 220 VAC. However, depending on the input AC voltage, three switches SW1, SW2 and SW3 are required to select the correct circuits of the power supply unit.

The power supply unit 1 is provided with a fuse 21 and a fuse 22 which are connected to the power source circuit 3 through the switch SW1. The fuse 21 is rated for an operating voltage of 110 VAC while the fuse 22 is rated for an operating voltage of 220 VAC.

The power source circuit 3 can operate at either the input voltage of 110 VAC or 220 VAC, and provides required AC and DC voltages necessary to operate the electrophotographic imaging device. Therefore, the switch SW2 is provided to switch an internal circuit of the power source circuit 3, in order to select the desired input operating voltage.

In an electrophotographic imaging device, a halogen lamp is used for generating heat for a fixing unit. Power for the halogen lamp is usually supplied from the power line directly. In this first embodiment, an output connector 4 supplies power to the halogen lamp. The output connector has three terminals. The terminal N is a neutral terminal, and is connected to the neutral side of the power plug 2. The other two receptor terminals are connected to two terminals of the switch SW3. The switch SW3 selects one of the two terminals of the output connector 3 depending on the line voltage of the electrical grid to which the power supply unit 3 is connected.

Figure 2:
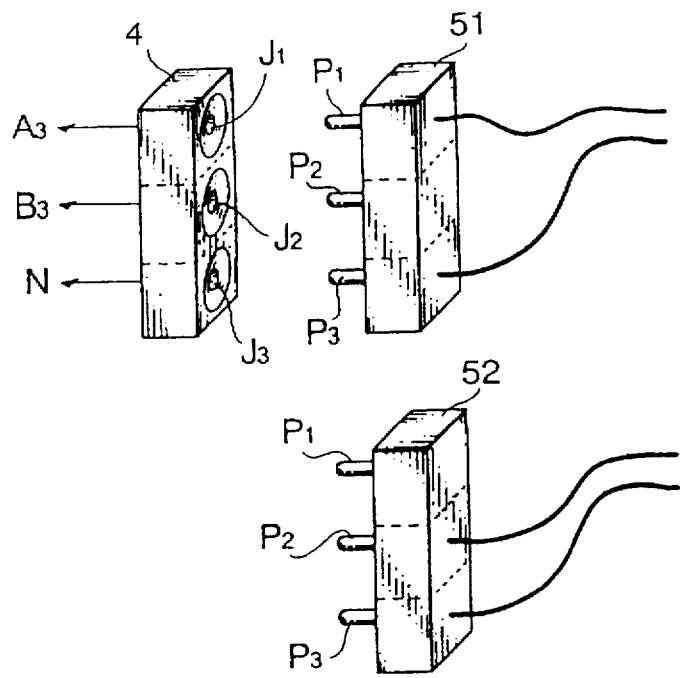
FIG. 2 is a diagram of a connector used to connect a halogen lamp to the power supply unit shown in FIG. 1.

FIG. 2 shows the output connector 4 having three jacks J1, J2 and J3. Jacks J1 and J2 are connected to switch SW3 while jack J3 is connected to the neutral terminal N. The halogen lamp (not shown) is connected to either a connector 51 or a connector 52, depending on the operating voltage of the halogen lamp. If the electrophotographic imaging device is to be used with a 110 VAC input line voltage, then the halogen lamp (which in this case is rated at 110 VAC) will be connected to the connector 51. Further, pins P1 and P3 of the connector 51 will be connected to the halogen lamp. Thus, when the connector 51 is connected to the output connector 4, the halogen lamp is connected to the receptor terminals A3 and N.

Similarly, if the electrophotographic imaging device is to be used with a 220 VAC input line voltage, then the halogen lamp (which in this case is rated at 220 VAC) will be connected to the connector 52. Further, pins P2 and P3 of the connector 52 will be connected to the halogen lamp. Thus, when the connector 52 is connected to the output connector 4, the halogen lamp is connected to the receptor terminals B3 and N.

The selection of the appropriate operating circuits of the power supply unit 1 shown in FIG. 1 will be described below.

If the input voltage to the power supply unit 1 is 110 VAC, the fuse 21 must be connected between the plug 2 and the input to the power source unit 3. Therefore SW1 must be set such that a source terminal S1 contacts a receptor terminal A1 connected to the fuse 21. Further, the switch SW2 is set such that a source terminal S2 contacts a receptor terminal A2 connected to the power source unit 3. This sets the internal circuitry of the power source unit to operate from the 110 VAC input line voltage. Similarly, switch SW3 is set such that a source terminal S3 contacts the receptor terminal A3 which is connected to the jack J1 of the output connector 4.

With the switches SW1, SW2 and SW3 set as described above, proper operation of the power supply unit can be achieved when the input voltage is 110 VAC.

If the input voltage is 220 VAC, then SW1 is set such that the source terminal S1 contacts the receptor terminal B1 connected to the fuse 22. Further, the switch SW2 is set such that the source terminal S2 contacts the receptor terminal B2. This sets the internal circuitry of the power source unit to operate from the 220 VAC input line voltage. The switch SW3 is set such that the source terminal S3 contacts the receptor terminal B3 which is connected to the jack J2 of the output connector 4.

Therefore, as described above, if the halogen lamp rated at 110 VAC, and having the connector 51, is connected to the output connector 4, and the switch SW3 is accidentally set such that the source terminal S3 is connected to the receptor terminal B3, then the line voltage will be applied to the pin P2 of the connector 51. In this case, the halogen lamp is not connected to the pin P2 and therefore the halogen lamp will remain OFF.

Similarly, if the halogen lamp rated at 220 VAC, and having the connector 52, is connected to the output connector 4, and the switch SW3 is accidentally set such that the source terminal S3 is connected to the receptor terminal A3, then the line voltage will be applied to the pin P1 of the connector 52. In this case, the halogen lamp is not connected to the pin P1 and therefore the halogen lamp will remain OFF. Thus, damage to the halogen lamp can be prevented even if the switch SW3 is switched such that the source terminal S3 is connected to the wrong terminal of the output connector 4.

Figure 3:
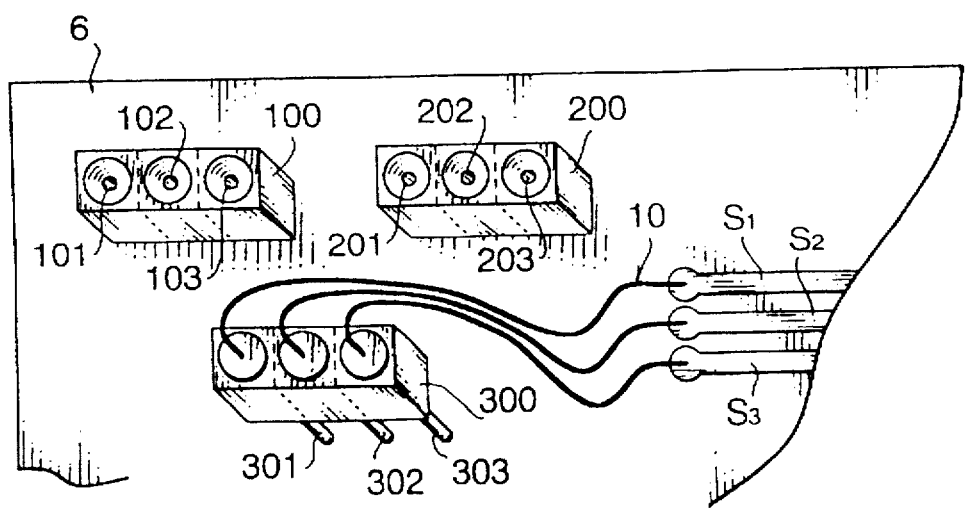
FIG. 3 shows a circuit connecting device according a first embodiment of the present invention.

FIG. 3 shows a diagram of an implementation of a circuit connecting device according to the first embodiment of the present invention.

As shown in FIG. 3, a circuit board 6 of the power source unit 3 has the source terminals S1, S2 and S3 formed at ends of circuit traces. These source terminals are connected by a bus 10 to a source connector 300. Pins 301, 302 and 303 of the source connector 300 are electrically connected to the source terminals S1, S2 and S3 respectively, through the bus 10.

Receptor connector 100 and receptor connector 200 are provided on the board 6. The receptor connector 100 has conductors in the form of jacks 101, 102 and 103, while the receptor connector 200 has conductors in the form of jacks 201, 202 and 203. The jacks 101, 102 and 103, are connected to the receptor terminals A1, A2 and A3, while the jacks 201, 202 and 203 are connected to the receptor terminals B1, B2 and B3. If the input voltage is 110 VAC, the source connector 300 is mated with the receptor connector 100. For an input of 220 VAC, the source connector 300 is mated with the receptor connector 200. Therefore, by mating the source connector 300 with the receptor connector 100 or the receptor connector 200, the power supply unit 1 can be configured to operate from 110 VAC or 220 VAC, respectively.

Further, the mating of the source connector 300 to the receptor connector 100 (200) simultaneously inserts the pins 301, 302 and 303 into the jacks 101, 102 and 103 (201, 202, 203), respectively, of the receptor connector 100 (200). Therefore, the mating of the source connector 300 to the receptor connector 100 (200) simultaneously connects each of the source terminals S1, S2 and S3 to their corresponding receptor terminals A1, A2 and A3 (B1, B2 and B3). Thus, all three switches SW1, SW2 and SW3 are switched to their proper configuration simultaneously, and it is therefore not possible for one of the switches SW1, SW2 or SW3 to be incorrectly set.

Figure 4:
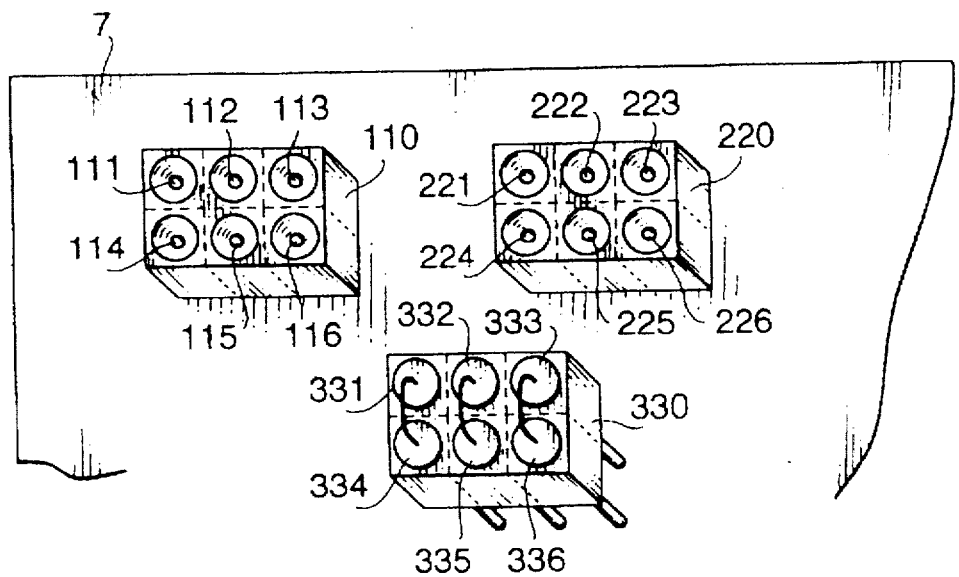
FIG. 4 shows a circuit connecting device according a second embodiment of the present invention.

FIG. 4 shows a diagram of an implementation of a circuit connecting device according to a second embodiment of the present invention.

AS shown in FIG. 4, a circuit board 7 of the power source unit 3 has connector 110 and connector 220 provided thereon. The connector 110 has conductors in the form of jacks 111, 112, 113, 114, 115 and 116 which are connected to the receptor terminals A1, A2, and A3, and the source terminals S1, S2 and S3, respectively. The connector 220 has conductors in the form of jacks 221, 222 223, 224, 225, and 226 which are connected to the receptor terminals B1, B2, and B3, and the source terminals S1, S2 and S3, respectively.

As further shown in FIG. 4, a bridge connector 330 is provided which has conductors in the form of pins 331, 332, 333, 334, 335, and 336. The bridge connector 330 is wired such that the pins 331 and 334 are electrically connected, the pins 333 and 336 are electrically connected, and the pins 331 and 334 are electrically connected.

Therefore, if the input operating voltage is 110 VAC, the bridge connector 330 is mated with the connector 110, with the pins 331, 332, 333, 334, 335, and 336 of the bridge connector 330 being simultaneously inserted into the jacks 111, 112, 113, 114, 115 and 116 of the connector 110. Therefore the receptor terminals A1, A2, and A3 are simultaneously connected with the source terminals S1, S2 and S3, respectively.

Similarly, if the input operating voltage is 220 VAC, the bridge connector 330 is mated with the connector 220, with the pins 331, 332, 333, 334, 335, and 336 of the bridge connector 330 being simultaneously inserted into the jacks 221, 222, 223, 224, 225 and 226 of the connector 220. Therefore the receptor terminals B1, B2, and B3 are simultaneously connected with the source terminals S1, S2 and S3, respectively.

Therefore, when the bridge connector 330 is mated with one of the connectors 110, 220, all three switches SW1, SW2 and SW3 are switched to their proper configuration simultaneously, and it is not possible for one of the switches SW1, SW2 or SW3 to be incorrectly set.

Figure 5:
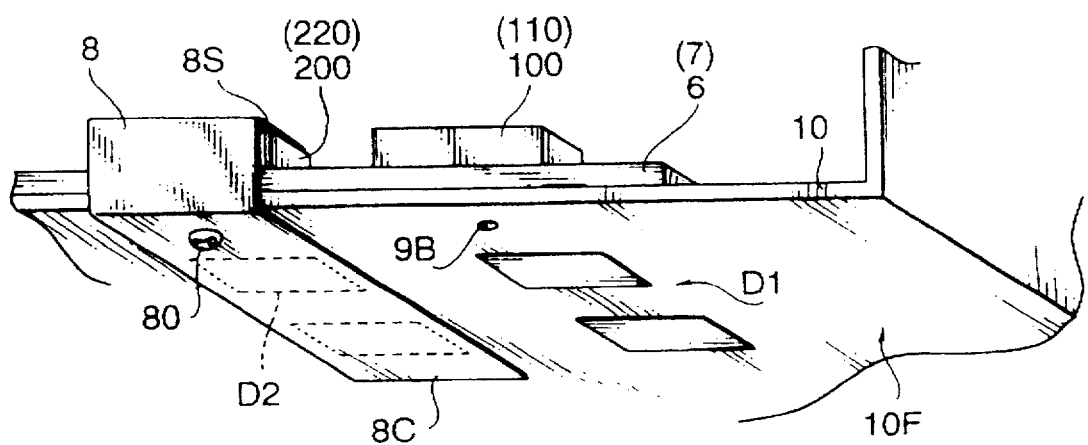
FIG. 5 shows a bottom view of a printed circuit board of the power supply unit shown in FIG. 1.

FIG. 5 shows a bottom view of a circuit board cover member 8. The circuit board cover member 8 is used to cover a portion of the circuit boards 6 and 7 which are mounted to a casing 10. The cover member 8 has a support 8S, a cover 8C and a screw 80. Information plates D1 and D2 printed with power supply information are attached to a lower surface 10F of the casing 10.

As shown in FIG. 5, if the power supply unit 1 is connected to a 110 VAC voltage supply, then the cover member 8 has the screw 80 screwed into a threaded hole 9A (not shown), thereby covering the receptor connector 200 (connector 220) and the information plate D2. Therefore, the source connector 300 (bridge connector 330) can only be mated with the receptor connector 100 (connector 110). Further, only the information plate D1 is visible.

Similarly, if the power supply unit 1 is connected to a 220 VAC voltage supply, then the cover member 8 has the screw 80 screwed into a threaded hole 9B, thereby covering the receptor connector 100 (connector 110) and the information plate D2. Therefore, the source connector 300 (bridge connector 330) can only be mated with the receptor connector 200 (connector 220). Further, only the information plate D2 is visible.

As described above, the power supply unit 1 embodying the present invention can be set such that it will operate correctly for either of the two input voltages, 110 VAC or 220 VAC. Further, as a single structure in the form of a connector is used to vary the positions of a plurality of switches, improper selection of one of the switches SW' through SW3 is prevented.

In the above embodiments, only three switches SW1 through SW3 are shown. However, this invention may be applied to a circuit having any number of switches in which all the switches are switched simultaneously between two or more values. In this case, only the number of pins and jacks on the various connectors needs to be changed in accordance with the number of switches.

Further, in the above embodiments, each set of receptor terminals has a connector, and the connector for the source terminals is plugged into one of the receptor terminals. However, it is possible to have only one receptor connector which has separate sets of pins connected to separate sets of receptor terminals. Then, the source connector is plugged into a portion of the receptor connector which is electrically connected to the desired receptor terminals. Alternatively, the receptor connector could have another set of pins which would be electrically connected to the source terminals. Then, a bridge connector could be plugged into the receptor connector to connect the source terminals to a desired set of receptor terminals.

Furthermore, in the above embodiments, only two voltage ranges are used. However, the present invention is not limited to only two ranges, but may be used with a power supply unit having three or more operating voltages. In this case, the cover member would cover all the receptor connectors that are not to be connected to the source connector, as well as all of the information plates corresponding to the unconnected receptor connectors.

The present disclosure relates to subject matter contained in Japanese Patent Application No. HEI 6-067833, filed on Mar. 11, 1994 which is expressly incorporated herein by reference in its entirety.

What is claimed is:

1. A circuit characteristic setting device used to set a characteristic of a circuit, said circuit including a plurality of selector switches that set said characteristic of said circuit, each of said selector switches defined by a source terminal and a plurality of receptor terminals, said circuit characteristic setting device comprising:

a connector that is electrically connected to each of said source terminals of said plurality of selector switches;

a plurality of distinct sets of receptors, each of said distinct sets of receptors being electrically connected to distinct ones of each of said plurality of receptor terminals of each of said plurality of selector switches;

whereby selective connection of said connector to one of said plurality of distinct sets of receptors sets the condition of the plurality of selector switches simultaneously.

2. The circuit characteristic determining device according to claim 1, wherein said determined characteristic is an input operating voltage of said circuit.

3. The circuit characteristic determining device according to claim 1, said circuit being utilized in a power supply unit.

4. The circuit characteristic setting device according to claim 1, each of said plurality of distinct sets of receptors being formed on a circuit board.

5. The circuit characteristic setting device according to claim 1, further comprising at least one cover member, said cover member being positionable to cover an other of said plurality of distinct sets of receptors to which said connector is not connected.

6. The circuit characteristic setting device according to claim 5, further comprising a support member, said support member containing a plurality of information areas each containing information relating to one of the characteristics of the circuit, wherein, when said cover member is positioned to cover said other of said plurality of distinct sets of receptors to which said connector is not connected, said cover member covers one of said information areas containing information relating to the characteristic set by said other of said plurality of distinct sets of receptors to which said connector is not connected.

7. The circuit characteristic setting device according to claim 1, said plurality of distinct sets of receptors mounted on a circuit board, said circuit board associated with a support having a plurality of information areas each containing information related to the characteristic set by each of said plurality of distinct sets of receptors; and a cover member selectively attachable to said casing to cover an other of said plurality of distinct sets of receptors to which said connector is not connected and to cover one of said information areas containing information related to the characteristic set by said other of said plurality of distinct sets of receptors covered by said cover member.

8. A circuit characteristic setting device used to determine a characteristic of a circuit, said circuit including a plurality of selector switches that set said characteristic of said circuit, each of said selector switches defined by a source terminal and a plurality of receptor terminals, said circuit characteristic setting device comprising:

a plurality of distinct sets of receptors, each of said distinct sets of receptors being electrically connected, for each of said plurality of selector switches, to a distinct one of said plurality of receptor terminals; and a connector that, when selectively placed in one of said plurality of distinct sets of receptors, electrically connects said source terminal and said predetermined one of said plurality of receptor terminals for each of said plurality of selector switches simultaneously.

9. The circuit characteristic determining device according to claim 8, wherein said determined characteristic is an input operating voltage of said circuit.

10. The circuit characteristic determining device according to claim 8, said circuit being utilized in a power supply unit.

11. The circuit characteristic setting device according to claim 8, wherein each of said plurality of distinct sets of receptors are formed on a circuit board.

12. The circuit characteristic setting device according to claim 8, further comprising at least one cover member, said cover member being positionable to cover an other of said plurality of distinct sets of receptors to which said connector is not electrically connected.

13. The circuit characteristic setting device according to claim 12, further comprising a support, said support containing a plurality of information areas each containing information relating to one of the characteristics of the circuit, wherein, when said cover member is positioned to cover said other of said plurality of distinct sets of receptors to which said connector is not electrically connected, said cover member covers one of said information areas containing information relating to the characteristic related to said other of said plurality of distinct sets of receptors to which said connector is not electrically connected.

14. The circuit characteristic setting device according to claim 8, said plurality of distinct sets of receptors mounted on a circuit board, said circuit board associated with a support having a plurality of information areas each containing information related to the characteristic set by each of the plurality of distinct sets of receptors; a cover member selectively attachable to said support to cover said other of said plurality of distinct sets of receptors to which said connector is not electrically connected and to cover one of said information areas containing information related to the characteristic set by said plurality of distinct sets of receptors covered by said cover member.

15. A circuit characteristic setting device used to determine a characteristic of a circuit, said circuit including a plurality of selector switches associated with said characteristic of said circuit, each of said selector switches defined by a source terminal and a plurality of receptor terminals, said circuit characteristic setting device comprising:

a support member;

a plurality of source terminals supported on said support member, one of said source terminals corresponding to each of said selector switches;

a first discrete plurality of receptors including first receptor terminals corresponding to each of said plurality of selector switches;

a second discrete plurality of receptors including second receptor terminals corresponding to each of said plurality of selector switches;

a connector including a plurality of connector portions of each connected to a corresponding one of said source terminals, said connector selectively engageable with said first discrete plurality of receptors to set a first characteristic of said circuit and with said second discrete plurality of receptors to set a second characteristic of said circuit, wherein engagement of said connector with said first discrete plurality of receptors engages said connector portions with said first receptor terminals of each of said selector switches and engagement of said connector with said second discrete plurality of receptors engages said connector portions with said second receptor terminals of each of said selector switches.

16. The circuit connecting device according to claim 15, wherein said characteristic is an input operating voltage of said circuit.

17. The circuit connecting device according to claim 15, said circuit being utilized in a power supply unit.

18. The circuit setting device according to claim 15, further comprising at least one cover member, said cover member being selectively positionable to cover one of said first and second discrete plurality of receptors with which said connector is not engaged.

19. The circuit setting device according to claim 18, further including a plurality of information areas each containing information relating to one of the characteristics of said circuit, wherein, when said cover member is positioned to cover one of said first and second plurality of discrete receptors, said cover member covers one of said information areas containing information relating to said covered plurality of discrete receptors.

* * * * *